(12) United States Patent
Lesso et al.

(10) Patent No.: US 11,849,643 B2
(45) Date of Patent: Dec. 19, 2023

(54) CIRCUITRY FOR ESTIMATING DISPLACEMENT OF A PIEZOELECTRIC TRANSDUCER

(71) Applicant: Cirrus Logic International Semiconductor Ltd., Edinburgh (GB)

(72) Inventors: John P. Lesso, Edinburgh (GB); Robert A. Steven, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 267 days.

(21) Appl. No.: 17/216,767

(22) Filed: Mar. 30, 2021

(65) Prior Publication Data
US 2022/0328752 A1    Oct. 13, 2022

(51) Int. Cl.
| | |
|---|---|
| *H01L 41/04* | (2006.01) |
| *H10N 30/40* | (2023.01) |
| *H10N 30/20* | (2023.01) |
| *H10N 30/80* | (2023.01) |

(52) U.S. Cl.
CPC ............ *H10N 30/40* (2023.02); *H10N 30/20* (2023.02); *H10N 30/802* (2023.02)

(58) Field of Classification Search
CPC ....... H10N 30/20; H10N 30/40; H10N 30/802
USPC ......................................................... 310/317
See application file for complete search history.

(56) References Cited

U.S. PATENT DOCUMENTS

| | | |
|---|---|---|
| 8,659,208 B1 | 2/2014 | Rose et al. |
| 2017/0347189 A1 | 11/2017 | Thyssen |

FOREIGN PATENT DOCUMENTS

| | | |
|---|---|---|
| EP | 1270090 A1 | 1/2003 |
| JP | 3010591 B2 | 2/2000 |

OTHER PUBLICATIONS

International Search Report and Written Opinion of the International Searching Authority, International Application No. PCT/GB2022/050255, dated Apr. 21, 2022.

*Primary Examiner* — Derek J Rosenau
(74) *Attorney, Agent, or Firm* — Jackson Walker L.L.P

(57) ABSTRACT

Circuitry for estimating a displacement of a piezoelectric transducer in response to a drive signal applied to the piezoelectric transducer, the circuitry comprising: monitoring circuitry configured to be coupled to the piezoelectric transducer and to output a sense signal indicative of an electrical signal associated with the piezoelectric transducer as a result of the drive signal; wherein the circuitry is configured to generate a difference signal based on the drive signal and the sense signal; and wherein the circuitry further comprises processing circuitry configured to apply at least one transfer function to the difference signal to generate a signal indicative of the displacement of the piezoelectric transducer.

20 Claims, 6 Drawing Sheets

CIRCUITRY FOR ESTIMATING DISPLACEMENT OF A PIEZOELECTRIC TRANSDUCER

FIELD OF THE INVENTION

The present disclosure relates to circuitry for estimating a displacement of a piezoelectric transducer.

BACKGROUND

A piezoelectric transducer can be used as a high-precision actuator, to convert an applied signal such as a voltage or current to a mechanical displacement, e.g. movement of a diaphragm or membrane in a piezoelectric speaker, or linear or rotary movement in a piezoelectric motor.

Measuring the displacement of a piezoelectric transducer accurately is important in a variety of applications. A typical method for measuring the displacement of a piezoelectric transducer uses a large optical system. Such a system is useful for characterising the transducer, but is not practical for use in a product incorporating a piezoelectric transducer, such as a mobile telephone, camera or other small form-factor device.

SUMMARY

According to a first aspect, the invention provides circuitry for estimating a displacement of a piezoelectric transducer in response to a drive signal applied to the piezoelectric transducer, the circuitry comprising:
  monitoring circuitry configured to be coupled to the piezoelectric transducer and to output a sense signal indicative of an electrical signal associated with the piezoelectric transducer as a result of the drive signal;
    wherein the circuitry is configured to generate a difference signal based on the drive signal and the sense signal;
    and wherein the circuitry further comprises processing circuitry configured to apply at least one transfer function to the difference signal to generate a signal indicative of the displacement of the piezoelectric transducer.

The drive signal may comprise a voltage and the sense signal may be indicative of a current through the piezoelectric transducer as a result of the drive signal.

Alternatively, the drive signal may comprise a current and the sense signal may be indicative of a voltage across the piezoelectric transducer as a result of the drive signal.

The at least one transfer function may comprise a transfer function corresponding to a second order low pass filter.

The at least one transfer function may comprise a transfer function of the form:

$$T = \frac{1 + \omega_0\left(\frac{1}{Q} + \omega_0\right)}{s^2 + \frac{\omega_0}{Q}s + \omega_0^2} G$$

where G is a gain.

The at least one transfer function may further comprise a transfer function corresponding to a first order high-pass filter and/or one or more transfer functions corresponding to a second order band-pass filter.

The at least one transfer function may comprise a transfer function corresponding to a first first order low-pass filter, a transfer function corresponding to a second first order low-pass filter, and/or one or more transfer functions corresponding to a second order band-pass filter.

The sense circuitry may comprise a sense impedance.

The sense impedance may comprise one or more of: a capacitor, a resistor and an inductor.

The circuitry may further comprise system identification circuitry configured to determine the transfer function.

The system identification circuitry may be configured to determine an impedance of the piezoelectric transducer based on the sense signal and the drive signal.

The system identification circuitry may be configured to determine the transfer function based on the determined impedance of the piezoelectric transducer.

The system identification circuitry may be configured to identify one or more resonance frequencies of the piezoelectric transducer based on the determined impedance.

The system identification circuitry may be configured to identify a first resonance frequency of the piezoelectric transducer, and to determine a first transfer function based on a frequency and a Q factor associated with the identified first resonance frequency.

The system identification circuitry may be configured to identify one or more further resonance frequencies of the piezoelectric transducer, and to determine one or more corresponding further transfer functions, each based on a frequency and a Q factor associated with a respective one of the one or more identified further resonance frequencies.

According to a second aspect, the invention provides circuitry for controlling a displacement of a piezoelectric transducer, the circuitry comprising:
  transducer driver circuitry for outputting a drive signal to the piezoelectric transducer;
  monitoring circuitry configured to be coupled to the piezoelectric transducer and to output a sense signal indicative of an electrical signal associated with the piezoelectric transducer as a result of the drive signal;
  wherein the circuitry is configured to generate a difference signal based on the drive signal and the sense signal;
  wherein the circuitry further comprises processing circuitry configured to apply a transfer function to the difference signal to generate a signal indicative of a displacement of the piezoelectric transducer,
  and wherein the drive signal is based on an error signal between an input signal to the circuitry, the input signal representative of a desired displacement of the piezoelectric transducer, and the signal indicative of the displacement.

According to a third aspect, the invention provides circuitry for controlling a sound pressure level at a piezoelectric transducer, the circuitry comprising:
  transducer driver circuitry for outputting a drive signal to the piezoelectric transducer;
  monitoring circuitry configured to be coupled to the piezoelectric transducer and to output a sense signal indicative of an electrical signal associated with the piezoelectric transducer as a result of the drive signal;
  wherein the circuitry is configured to generate a difference signal based on the drive signal and the sense signal;
  wherein the circuitry further comprises processing circuitry configured to apply a transfer function to the difference signal to generate a signal indicative of a sound pressure level at the piezoelectric transducer,
  and wherein the drive signal is based on an error signal between an input signal to the circuitry, the input signal indicative of a desired sound pressure level at the piezoelectric transducer, and the signal indicative of an actual sound pressure level.

According to a fourth aspect, the invention provides an integrated circuit comprising the circuitry of the first, second or third aspect.

According to a fifth aspect, the invention provides a system comprising the circuitry of the first, second or third aspect and a piezoelectric transducer.

BRIEF DESCRIPTION OF THE DRAWINGS

Embodiments of the invention will now be described, strictly by way of example only, with reference to the accompanying drawings, of which.

DETAILED DESCRIPTION

The present disclosure relates to a system for estimating, inferring or otherwise determining the displacement of a piezoelectric transducer for a given applied voltage, based on measurement of electrical parameters, and to circuitry for controlling a displacement of a piezoelectric transducer.

Figure 1:
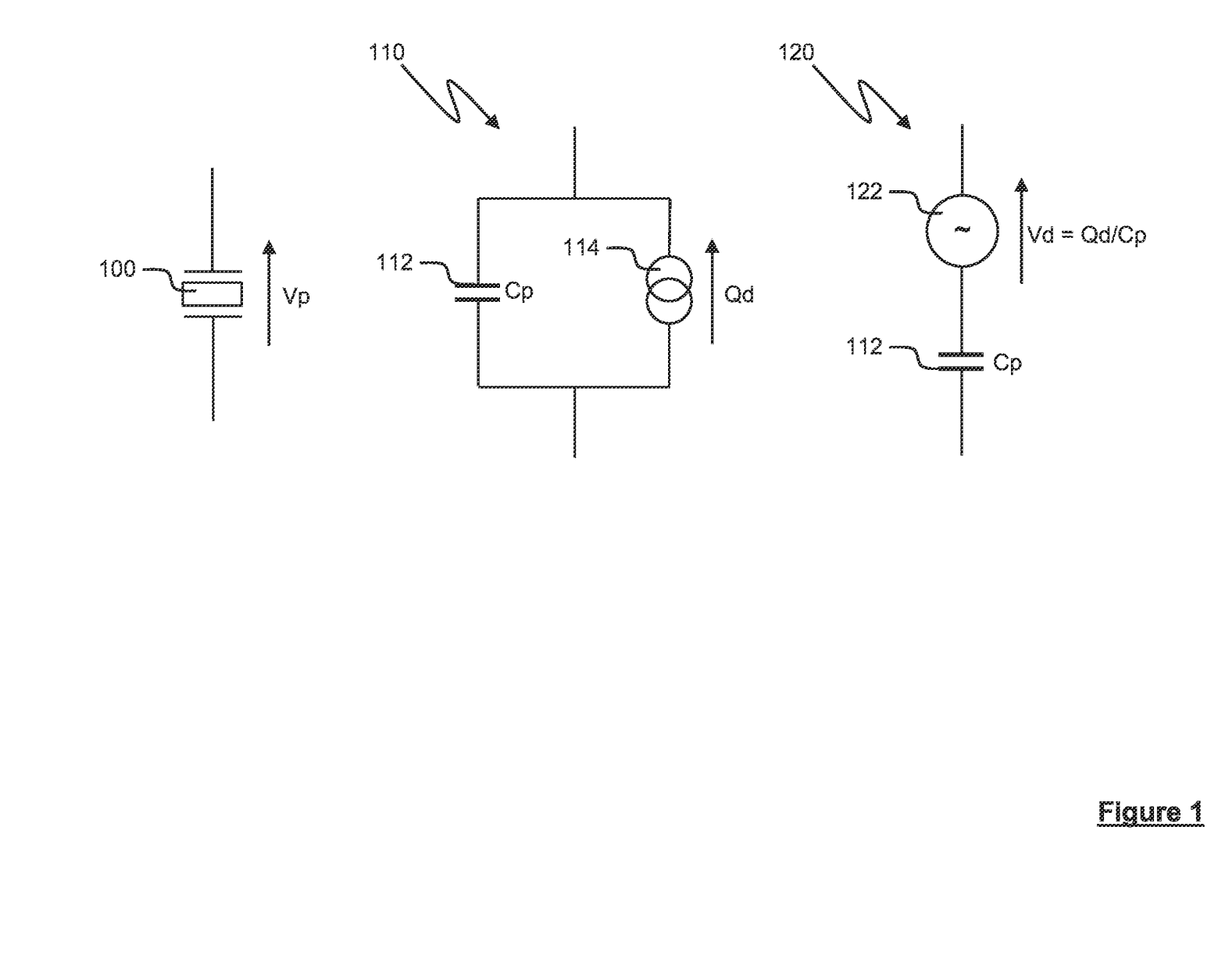
FIG. 1 is a schematic diagram illustrating a model of a piezoelectric transducer.

FIG. 1 illustrates an electrical model of a piezoelectric transducer. A piezoelectric transducer 100 can be modelled, as shown generally at 110, as a fixed capacitor of capacitance Cp in parallel with a variable charge source 114, where the charge Qd is a function of the displacement of the piezoelectric material of the piezoelectric transducer 100 (which is referred to here for simplicity as the "displacement of the piezoelectric transducer"). This can be shown to be equivalent to the model shown generally at 120, of a fixed capacitor 112 of capacitance Cp in series with a variable voltage source 122, where the variable voltage Vd is equal to Qd/Cp. The model 120 enables the tracking of hysteresis, creep and ageing, as these are all represented in the variable charge Qd.

Figure 2:
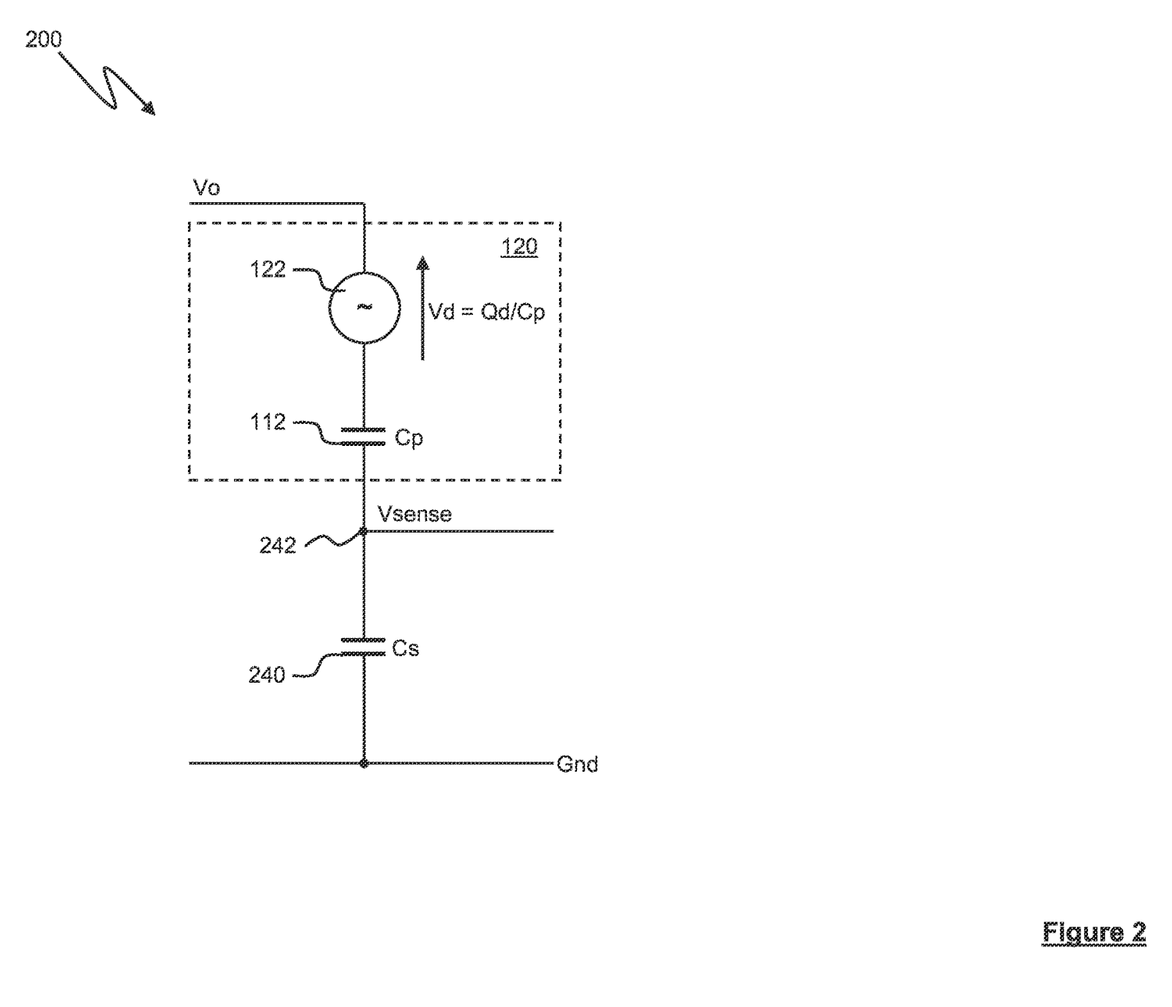
FIG. 2 is a schematic diagram illustrating circuitry for measuring a voltage associated with the model of FIG. 1.

FIG. 2 is a schematic diagram illustrating circuitry for measuring (or estimating or otherwise determining) the voltage Vd. The circuitry, shown generally at 200 in FIG. 2, includes a piezoelectric transducer (represented in FIG. 2 by the model 120) coupled in series with a current sense impedance 240 (which in the illustrated example is a capacitor having a capacitance value Cs, but which could equally be any other impedance, e.g. a resistor, inductor or some combination of a resistor and/or a capacitor and/or an inductor) between a voltage source Vo and a ground (or other reference voltage) supply rail.

As will be appreciated by those of ordinary skill in the art, the equivalent capacitance Cp of the piezoelectric transducer 120 and the current sense impedance 240 form a voltage divider.

In the illustrated example a voltage Vsense, which is indicative of a current through the piezoelectric transducer 120 when the drive voltage Vo is applied to it, that develops at a node 242 between the piezoelectric transducer 120 and the current sense impedance 240 when the drive voltage Vo is applied to the piezoelectric transducer 120 can be expressed as:

$$V_{sense} = (V_o - V_d)\frac{C_p}{C_s + C_p} \quad (1)$$

Thus the voltage Vd can be determined according to the expression:

$$V_d = V_o - V_{sense}\left(\frac{C_s + C_p}{C_p}\right) \quad (2)$$

The term $$\frac{C_s + C_p}{C_p}$$

can be replaced by a gain term K. Hence:

$$V_d = V_o - KV_{sense} \quad (3)$$

As discussed above, Vd is equal to Qd/Cp, where Qd is a charge that varies as a function of the displacement of the piezoelectric transducer 100. Thus, Vd is related to the displacement of the piezoelectric transducer 120, but is not an accurate representation of the displacement.

To obtain a more accurate representation or estimate of the displacement of the piezoelectric transducer 120 caused by the applied drive voltage Vo, the dynamic behaviour of the piezoelectric transducer 120 should also be taken into account.

The dynamic behaviour of the piezoelectric transducer 120 includes a mechanical aspect and an electrical aspect. The mechanical aspect is governed by the expression:

$$\theta V_p = \alpha \ddot{x} + \beta \dot{x} + \gamma x \quad (4)$$

where:
Vp is the voltage across the piezoelectric transducer, in Volts;
α is a moving mass coefficient, in kilograms;
β is a damping parameter, in Newton-seconds/metre;
γ is a stiffness coefficient, in Newtons/metre;
x is the displacement of the transducer, in metres; and
θ is an electromagnetic coefficient, in Coulombs/metre.

The electrical aspect is governed by the expression:

$$Q_d = C_p V_p + \theta x \quad (5)$$

where:
Qd is a charge that varies as a function of the displacement of the piezoelectric transducer, in Coulombs;
Cp is the equivalent capacitance of the piezoelectric transducer, in Farads;
Vp is a voltage applied to the piezoelectric transducer, in Volts;
x is the displacement of the transducer, in metres; and
θ is the electromagnetic coefficient, in Coulombs/metre.

Based on the expressions above, the relationship between the displacement x and the charge Qd (which is representative of the displacement x, since Qd varies as a function of displacement) can be derived:

$$Qd = \frac{Cp}{\theta}(\alpha \ddot{x} + \beta \dot{x} + \gamma x) + \theta x \quad (6)$$

This can be converted into a transfer function T1 using the Laplace transform:

$$T1 = \frac{X(s)}{Qd(s)} = G\left(\frac{1}{\alpha s^2 + \beta s + \left(\gamma + \frac{\theta^2}{Cp}\right)}\right) \quad (7)$$

where G is a gain term.

The transfer function T1 has a −40 dB/decade gradient in its magnitude response, and thus corresponds to (and can be implemented by) a second order low pass filter with a very low cutoff frequency $f_c$ (e.g. of the order of 0.01 Hz) and Q=1, of the form:

$$T1 = \frac{1 + \omega_0\left(\frac{1}{Q} + \omega_0\right)}{s^2 + \frac{\omega_0}{Q}s + \omega_0^2} G \quad (8)$$

Thus by measuring, estimating or otherwise determining Vd and applying the transfer function T1, an estimate of the displacement of the piezoelectric transducer for a given drive voltage Vo can be generated.

However, the transfer function T1 only partially models the behaviour of the piezoelectric transducer 120, as it models only the loading of a membrane of the transducer, and thus an estimate of the displacement generated using T1 may not be sufficiently accurate in some applications.

For a more complete model of the behaviour of the piezoelectric transducer 120, spring loading due to simple harmonic motion and additional resonances above the main resonance of the piezoelectric transducer can also be modelled.

The spring loading may be modelled, for example, by a filter with a first order high-pass response, having a cutoff frequency $f_c$ equal to $\omega_0/2\pi$, where $\omega_0$ is the estimated resonance frequency of the main resonance of the piezoelectric transducer.

The additional resonances above the main resonance of the piezoelectric transducer can be modelled by second order band-pass filters, each having a cutoff frequency $f_c$ equal to $\omega_0/2\pi$, where $\omega_0$ is the estimated resonance frequency of an additional resonance of the piezoelectric transducer.

Thus, an overall transfer function T between the displacement x of the piezoelectric transducer and the charge Qd on the piezoelectric transducer can be modelled and implemented by a combination of: i) a second order low pass filter having the transfer function T1, with $f_c$ of the order of 0.01 Hz and Q=1; ii) a first order high-pass filter; and/or iii) one or more second order band pass filters.

As will be apparent to those of ordinary skill in the art, an estimate of the displacement based on a combination of filters i), ii) and iii) will be more accurate than an estimate based on a combination of filters i) and ii) or i) and iii). Thus, the combination of filters used to implement the overall transfer function T may vary according to a required accuracy of the displacement estimate.

The overall transfer function T can equivalently be modelled and implemented by a combination of i) a first first order low-pass filter having a cutoff frequency $f_c$ of the order of 0.01 Hz; ii) a second first order low-pass filter having a cutoff frequency $f_c$ of the order of 1 kHz for example; and/or iii) one or more second order band pass filters. Again, the combination of filters used to implement the overall transfer function T may vary according to a required accuracy of the displacement estimate.

The first and second first order low-pass filters each have a transfer function $T_{LPF}$ of the form:

$$T_{LPF} = \frac{\omega_0}{s + \omega_0} \quad (9)$$

The second order bandpass filter(s) each have a transfer function $T_{BPF}$ of the form:

$$T_{BPF} = \frac{s\left(\frac{\omega_0}{Q}\right)}{s^2 + s\left(\frac{\omega_0}{Q}\right) + \omega_0^2} \quad (10)$$

By measuring, estimating or otherwise determining Vd and applying the overall transfer function T, a more accurate estimate of the displacement of the piezoelectric transducer for a given drive voltage Vo can be generated than if only the transfer function T1 is used.

Figure 3:
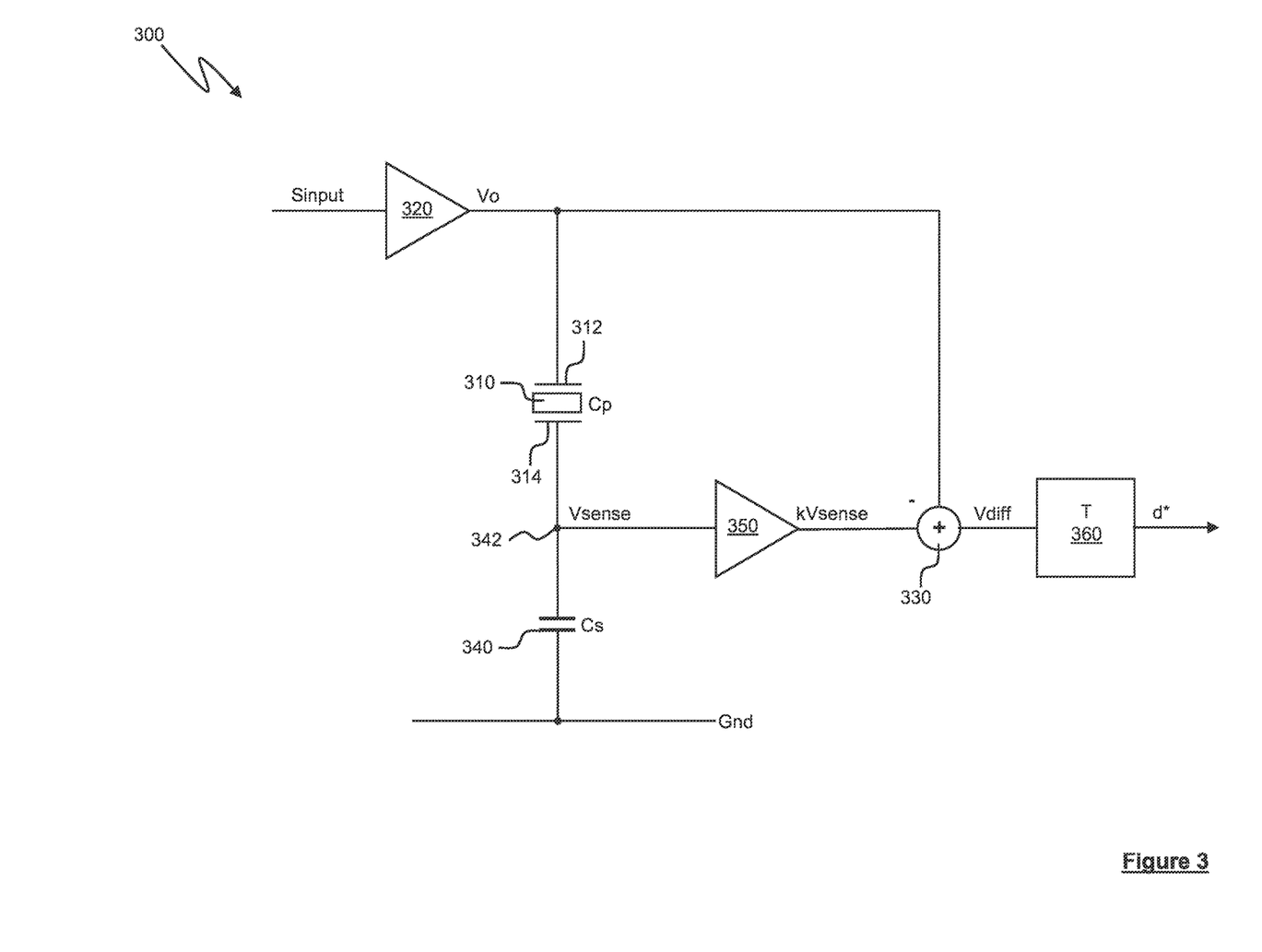
FIG. 3 is a schematic representation of circuitry for estimating a displacement of a piezoelectric transducer.

FIG. 3 is a schematic representation of circuitry 300 for estimating a displacement of a piezoelectric transducer 310. The circuitry 300 exploits the model 120 described above to provide a signal d* representing an estimate of the displacement of the piezoelectric transducer in response to a drive voltage Vo applied to the piezoelectric transducer 310.

The circuitry 300 includes transducer driver circuitry 320, which may be, for example, amplifier circuitry or the like. An output of the transducer driver circuitry 320 is coupled to a first terminal 312 of the piezoelectric transducer 310, such that when an excitation signal Sinput is received at an input of the transducer driver circuitry 320, a drive signal Vo is supplied to the piezoelectric transducer 310, to cause a displacement of the piezoelectric transducer 310.

The output of the transducer driver circuitry is also coupled to a first input of a summing node 330, so as to supply the drive signal Vo to the summing node 330. The summing node 330 is configured to subtract a signal received at its second input from the signal received at its first input to generate a difference signal Vdiff.

A current sense impedance 340 (which in the illustrated example is a capacitor having a capacitance value Cs, but which could equally be any other impedance, e.g. a resistor, inductor or some combination of a resistor and/or a capacitor and/or an inductor) is coupled in series between a second terminal 314 of the piezoelectric transducer 310 and a ground or other reference voltage supply rail.

As will be appreciated by those of ordinary skill in the art, the equivalent capacitance Cp of the piezoelectric transducer 310 and the current sense impedance 340 form a voltage divider.

In the illustrated example a voltage Vsense, which is indicative of a current through the piezoelectric transducer 310 when the drive voltage Vo is applied to it, that develops at a node 342 between the second terminal 314 of the piezoelectric transducer 310 and the current sense impedance 340 when the drive voltage Vo is applied to the piezoelectric transducer 310 can be expressed as:

$$Vsense = (Vo - Vd)\frac{Cp}{Cs + Cp} \quad (11)$$

where Vd is the notional output voltage of the variable voltage source 122 in the model 120 on which the circuitry 300 is based.

Again, the term $$\frac{Cp}{Cs + Cp}$$

can be replaced by a gain term K. Hence:

$$Vd = Vo - KVsense \quad (12)$$

The node 342 is coupled to an input of amplifier circuitry 350, which applies a gain K to the signal Vsense and outputs a signal KVsense to a second input of the summing node 330.

The summing node 330 is configured to subtract the signal KVsense from the drive signal Vo to generate the difference signal Vdiff, where Vdiff=Vo−KVsense.

The difference signal Vdiff is representative of the notional output voltage Vd of the variable voltage source 122 in the model 120 on which the circuitry 300 is based. It will be recalled that in the model 120, Vd is equal to Qd/Cp, where Qd is a displacement-dependent charge, and Cp is the equivalent capacitance of the piezoelectric transducer 310.

An output of the summing node 330 is coupled to an input of signal processing circuitry 360, such that the signal processing circuitry 360 receives the difference signal Vdiff. The signal processing circuitry 360 is configured to apply the transfer function T described above to the difference signal Vdiff to generate the signal d* which represents an estimate of the displacement of the piezoelectric transducer 310 in response to the drive voltage Vo. In some examples, where a lower accuracy estimate of the displacement is acceptable, the signal processing circuitry 360 may be configured to apply the transfer function T1 described above to the difference signal Vdiff to generate the signal d*.

The signal d* can be used to control a feedback loop to drive the piezoelectric transducer 310 to achieve a desired displacement of the piezoelectric transducer, as will now be described with reference to FIG. 4.

Figure 4:
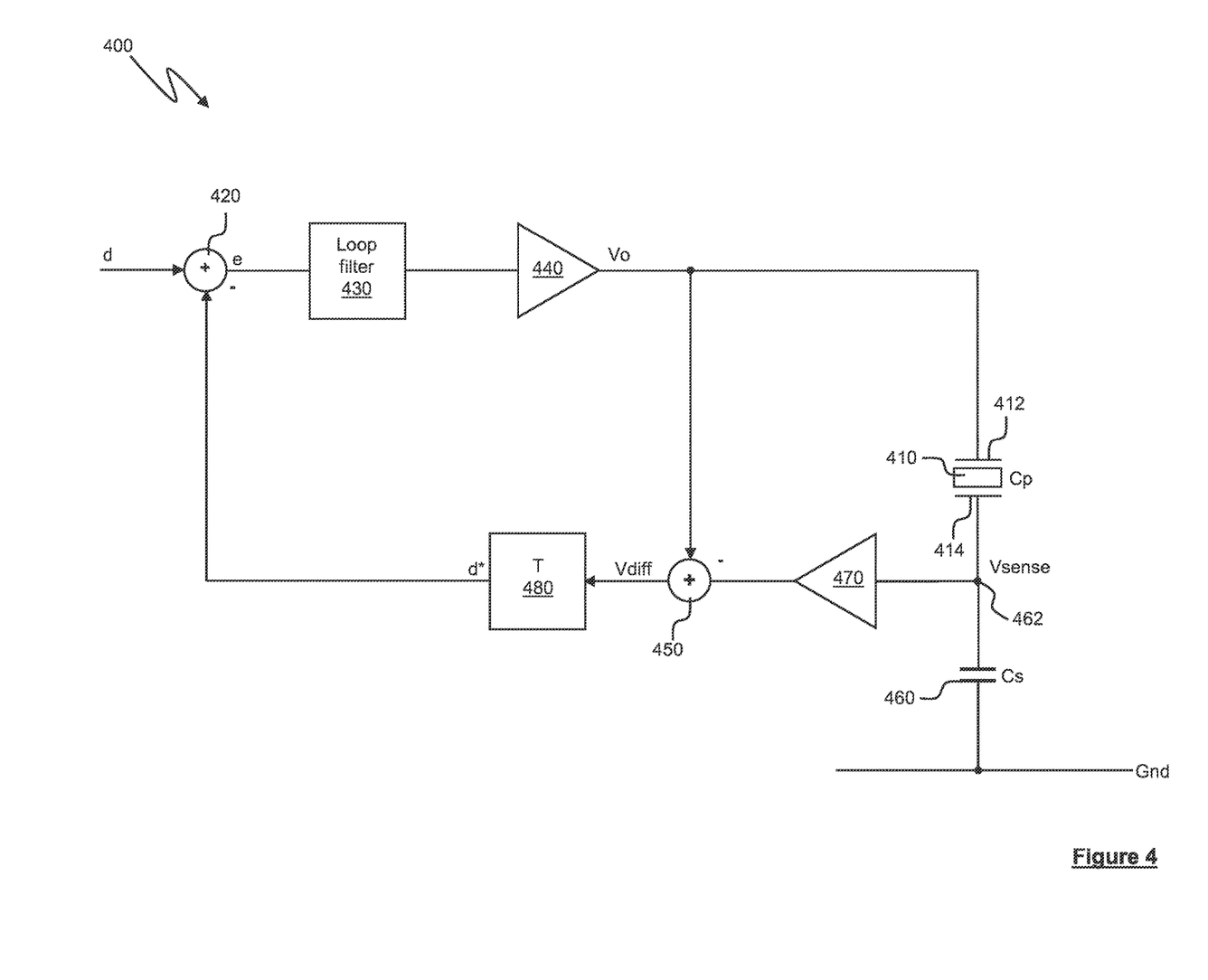
FIG. 4 is a schematic representation of drive circuitry for controlling a displacement of a piezoelectric transducer.

FIG. 4 is a schematic representation of drive circuitry for driving a piezoelectric transducer 410. The drive circuitry, shown generally at 400 in FIG. 4, includes a first summing node 420, which receives, at a first input thereof, a drive signal d representing a desired displacement of the piezoelectric transducer 410. The first summing node 420 is configured to subtract a signal received at its second input from the signal received at its first input to generate an error signal e.

An output of the first summing node 420 is coupled, via a loop filter 430, to transducer driver circuitry 440, which may be, for example, amplifier circuitry or the like. An output of the transducer driver circuitry 440 is coupled to a first terminal 412 of the piezoelectric transducer 410 so as to supply a drive signal Vo to the piezoelectric transducer 410, to cause a displacement of the piezoelectric transducer 410.

The output of the transducer driver circuitry 440 is also coupled to a first input of a second summing node 450, so as to supply the drive signal Vo to the second summing node 450. The second summing node 450 is configured to subtract a signal received at its second input from the signal received at its first input to generate a difference signal Vdiff.

A current sense impedance 460 (which in the illustrated example is a capacitor having a capacitance value Cs, but which could equally be any other impedance, e.g. a resistor, inductor or some combination of a resistor and/or a capacitor and/or an inductor) is coupled in series between a second terminal 414 of the piezoelectric transducer 410 and a ground or other reference voltage supply rail.

As in the circuitry 300 of FIG. 3, the piezoelectric transducer 410 and the current sense impedance 460 form a voltage divider, and a voltage Vsense develops at a node 462 between the current sense impedance 460 and the piezoelectric transducer 410.

The node 462 is coupled to an input of amplifier circuitry 470, which applies the gain K to the signal Vsense and outputs a signal KVsense to a second input of the second summing node 450.

The second summing node 450 is configured to subtract the signal KVsense from the drive signal Vo to generate the difference signal Vdiff, where Vdiff=Vo−KVsense.

An output of the second summing node 450 is coupled to an input of signal processing circuitry 480, such that the signal processing circuitry 480 receives the difference signal Vdiff. The signal processing circuitry 480 is configured to apply the transfer function T described above to the difference signal Vdiff to generate the signal d* which represents an estimate of the displacement of the piezoelectric transducer 410 in response to the drive voltage Vo. Thus, as will be appreciated, the circuitry 400 of FIG. 4 incorporates the circuitry 300 of FIG. 3.

An output of the signal processing circuitry 480 is coupled to the second input of the first summing node 420. Thus the error signal e output by the first summing node 420 is representative of the difference between the drive signal d representing the desired displacement of the piezoelectric transducer 410 and the signal d* representing an estimate of the actual displacement of the piezoelectric transducer 410. The signal processing circuitry 480, first summing node 420 and loop filter 430 thus provide a feedback loop that allows the piezoelectric transducer 410 to be driven with the drive voltage Vo to achieve the desired transducer displacement.

As will be appreciated, the transfer function T and the gain K need to be determined in the circuitry 300, 400. The transfer function T and the gain K can be predetermined, e.g. during a calibration process of the circuitry 300, 400, or can be determined dynamically during operation of the circuitry 300, 400.

The drive circuitry 400 of FIG. 4 receives a signal d representing a desired displacement of the piezoelectric transducer 410. In some applications, e.g. where the piezoelectric transducer 410 is used as an audio output transducer (e.g. a speaker), it may be desirable to input a signal representing a desired sound pressure level (SPL) at the piezoelectric transducer 410.

Figure 5:
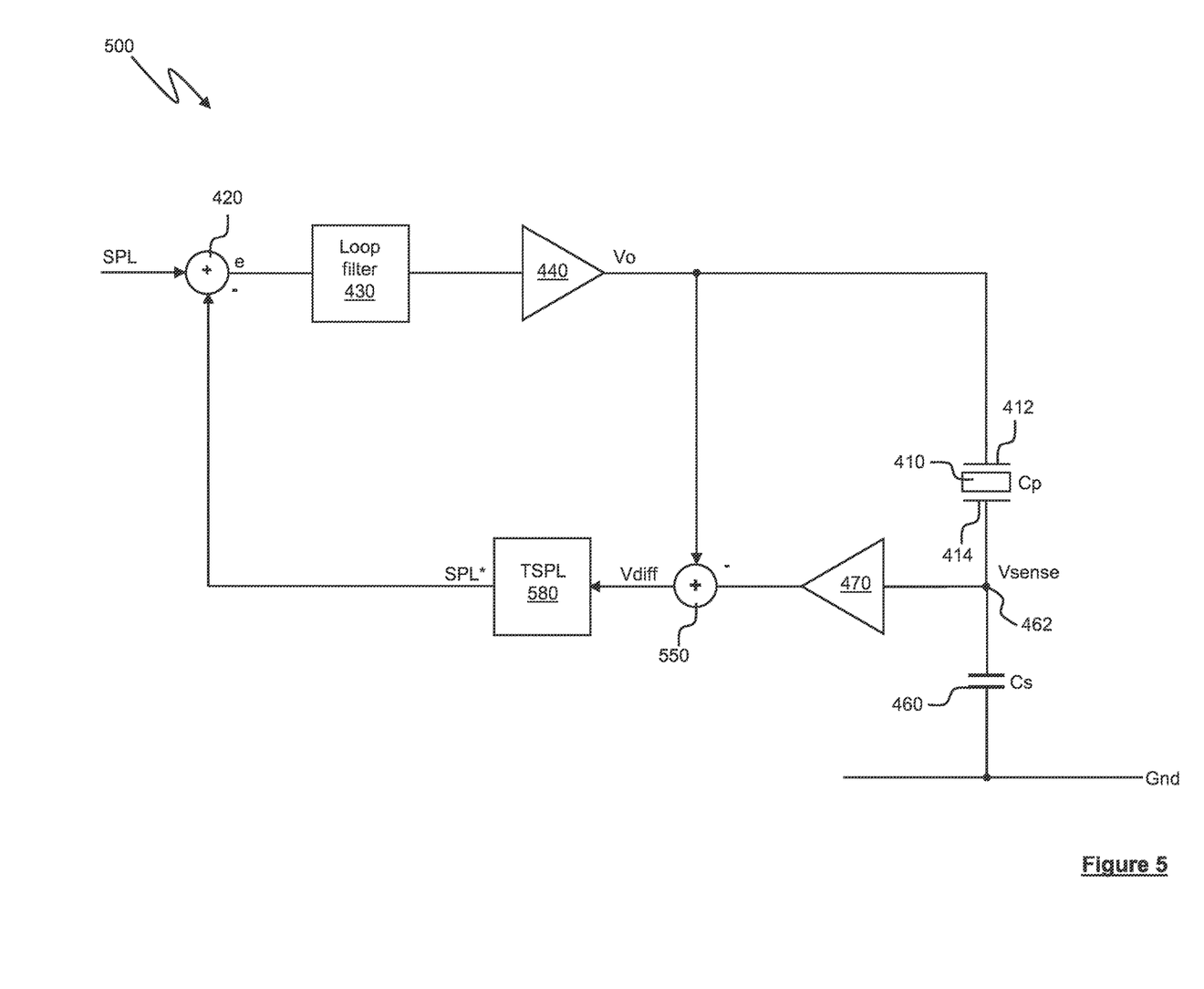
FIG. 5 is a schematic representation of drive circuitry for controlling a sound pressure level at a piezoelectric transducer.

FIG. 5 is a schematic representation of drive circuitry for driving a piezoelectric transducer 410 to achieve a desired SPL. The drive circuitry (shown generally at 500 in FIG. 5) includes a number of elements in common with the drive circuitry 400 of FIG. 4. Such common elements are denoted by common reference numerals in FIGS. 4 and 5 and will not be described in detail here.

The drive circuitry 500 differs from the drive circuitry 400 in that the first summing node 420 receives, at its first input, a drive signal SPL representing a desired sound pressure level at the piezoelectric transducer 410, and in that signal processing circuitry 580 of the drive circuitry 500 is configured to output a signal SPL* representing an estimate of the actual SPL at the piezoelectric transducer 410 arising as a result of a drive signal Vo that is output by the transducer driver circuitry 440 based on the drive signal SPL.

Thus in the drive circuitry 500 a transfer function TSPL applied by the signal processing circuitry 580 takes into account acoustic loading of the piezoelectric transducer 410 including factors such as the way in which the transducer 410 is mounted and ported, and thus represents the relationship between the displacement of the piezoelectric transducer 410 that occurs as a result of the applied drive signal Vo and the SPL at the piezoelectric transducer 410 resulting from its displacement.

Figure 6:
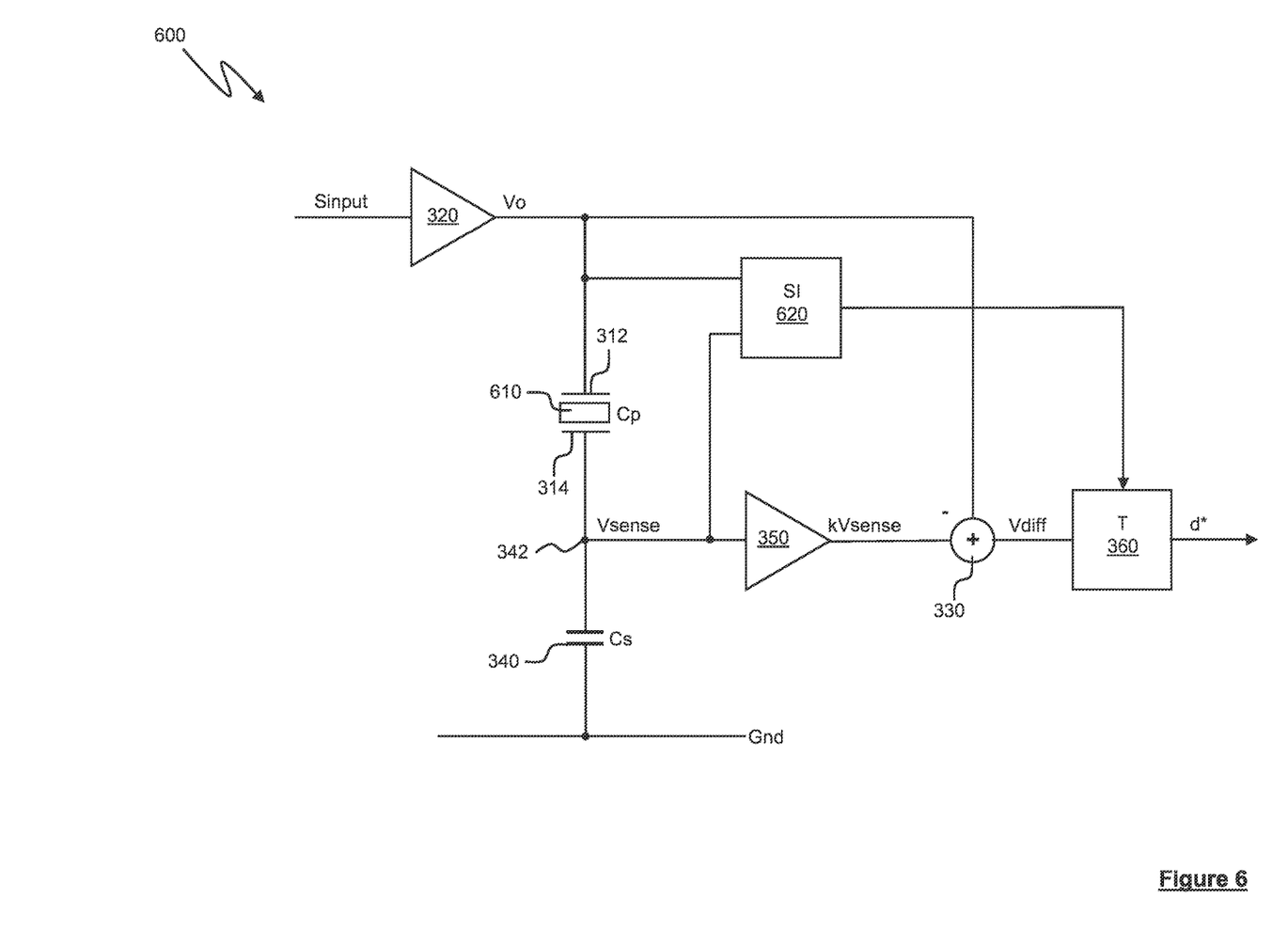
FIG. 6 is a schematic diagram illustrating circuitry for estimating a displacement of a piezoelectric transducer.

FIG. 6 is a schematic diagram illustrating circuitry for estimating a displacement of a piezoelectric transducer 610. The circuitry, shown generally at 600 includes a number of features in common with the circuitry of FIG. 3. Such common features are denoted by common reference signs, and will not be described again here.

The circuitry 600 differs from the circuitry 300 in that it includes system identification circuitry 620. The system identification circuitry 620 may comprise, for example, a microprocessor, a microcontroller, a state machine, an ASIC (application specific integrated circuit) or an FPGA (field programmable gate array), or any other circuitry suitable for performing the processing operations described herein.

The system identification circuitry 620 is configured to receive the signals Vo and Vsense. As indicated above, Vsense is representative of the current through the piezoelectric transducer when the drive voltage Vo is applied. Thus, the system identification circuitry 620 is configured to derive, estimate, calculate or otherwise determine an impedance of the transducer 610 based on the received signals Vo and Vsense.

The system identification circuitry 620 is further configured to derive, calculate or otherwise determine the transfer function T, based on the determined impedance of the piezoelectric transducer 610.

During a calibration process for the circuitry 600, an excitation signal Sinput may be provided to the transducer driver circuitry 320 to generate a known drive voltage Vo that can be used by the system identification circuitry to determine the impedance of the piezoelectric transducer 610, and hence also the overall transfer function T to be applied by the signal processing circuitry 360. The known drive voltage Vo may comprise, for example, a broadband signal such as a logarithmic chirp signal spanning a frequency range of interest.

The system identification circuitry 620 receives the signals Vo and Vsense, and determines the impedance of the piezoelectric transducer 610 over the frequency range of the signal Vo.

The impedances of the piezoelectric transducer 610 and the current sense impedance 340 form a potential divider, whose output voltage Vsense is defined as:

$$Vsense = Vo\frac{Zs}{Zp + Zs} \quad (13)$$

where Zs is the impedance of the current sense impedance 340 and Zp is the impedance of the piezoelectric transducer 610.

Thus $$Zp = \frac{Zs(Vo - Vsense)}{Vsense} \quad (14)$$

The impedance of the piezoelectric transducer can be estimated by the system identification circuitry 620 as $$Zp^* = Zs\left(\frac{x(Vo) - x(Vsense)}{x(Vsense)}\right) \quad (15)$$

where x( ) denotes the Hilbert transform.

Based on the estimated impedance Zp*, the system identification circuitry 620 can identify any resonances of the piezoelectric transducer 610 within the frequency range of interest.

Each resonance gives rise to a corresponding local minimum at a frequency $\omega_s$ and a corresponding local maximum at a frequency $\omega_p$ in the magnitude of the impedance of the piezoelectric transducer. The system identification circuitry 620 can identify the frequencies $\omega_s$ and $\omega_p$ for each resonance, and can estimate $\omega_0$ and Q for each resonance according to the relationships $$\omega_0 = \sqrt{\omega_p * \omega_s} \quad (16)$$

$$Q = \frac{\omega_0}{\omega_p - \omega_s} \quad (17)$$

The overall transfer function T can then be determined by the system identification circuitry 620 applying the estimated $\omega_0$ and Q values to the filter transfer functions (8), (9), (10) defined above.

The system identification circuitry 620 may transmit one or more control signals to the signal processing circuitry 360 to configure the signal processing circuitry 360 with the transfer function T1 and/or the transfer functions $T_{LPF}$ and with each additional transfer function $T_{BPF}$ as necessary.

Thus the system identification circuitry 620 can configure the signal processing circuitry 360 with a suitable overall transfer function T to enable the signal processing circuitry 360 to output the signal d* representing an estimate, at a desired level of accuracy, of the displacement of the transducer.

FIG. 6 shows the system identification circuitry 620 as being provided in combination with the circuitry 300 so as to output the signal d*, but it will be appreciated that the system identification circuitry 620 could also be provided in combination with or as part of the circuitry 400 of FIG. 4, in order to configure the signal processing circuitry 480 with the overall transfer function T, or in combination with or as part of the circuitry 500 of FIG. 5, in order to configure the signal processing circuitry 580 with the transfer function TSPL.

In the examples described above the drive signal Vo may be a voltage and the signal Vsense is representative of a current through the piezoelectric transducer, but it will be appreciated by those of ordinary skill in the art that the drive signal Vo could equally be a current (i.e. the piezoelectric transducer could be current-driven) and the signal Vsense could be representative of a voltage across the piezoelectric transducer.

As will be apparent from the foregoing discussion, the present disclosure provides circuitry and methods for estimating a displacement of a piezoelectric transducer based on electrical measurements. The estimated displacement can be used in a feedback loop to control the displacement of a piezoelectric transducer in response to a drive voltage. Thus, the circuitry and methods of the present disclosure permit estimation and control of the displacement of a piezoelectric transducer without large and complex measuring equipment, such that the disclosed circuitry is suitable for estimating and controlling the displacement of a piezoelectric transducer used in a small form factor device such as a mobile telephone, camera or the like.

The present disclosure extends to a system comprising the circuitry 300, 400, 500, 600 (which may be implemented, for example, as one or more integrated circuits), and a piezoelectric transducer.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device, or a gaming device such as a games console. The device could be a wearable device such as a smartwatch, eyewear (e.g. smart glasses) or the like. The device could be a virtual reality (VR) or augmented reality (AR) device such as a VR or AR headset. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for estimating a displacement of a piezoelectric transducer in response to a drive signal applied to the piezoelectric transducer, the circuitry comprising:
monitoring circuitry configured to be coupled to the piezoelectric transducer and to output a sense signal indicative of an electrical signal associated with the piezoelectric transducer as a result of the drive signal;
wherein the circuitry is configured to generate a difference signal based on the drive signal and the sense signal;
and wherein the circuitry further comprises processing circuitry configured to apply at least one transfer function to the difference signal to generate a signal indicative of the displacement of the piezoelectric transducer.

2. Circuitry according to claim 1, wherein the drive signal comprises a voltage and the sense signal is indicative of a current through the piezoelectric transducer as a result of the drive signal, or wherein the drive signal comprises a current and the sense signal is indicative of a voltage across the piezoelectric transducer as a result of the drive signal.

3. Circuitry according to claim 1, wherein the at least one transfer function comprises a transfer function corresponding to a second order low pass filter.

4. Circuitry according to claim 3, wherein the at least one transfer function comprises a transfer function of the form:

$$T = \frac{1 + \omega_0\left(\frac{1}{Q} + \omega_0\right)}{s^2 + \frac{\omega_0}{Q}s + \omega_0^2} G$$

where G is a gain.

5. Circuitry according to claim 3, wherein the at least one transfer function further comprises a transfer function corresponding to a first order high-pass filter and/or one or more transfer functions corresponding to a second order band-pass filter.

6. Circuitry according to claim 1, wherein the at least one transfer function comprises a transfer function corresponding to a first first order low-pass filter, a transfer function corresponding to a second first order low-pass filter, and/or one or more transfer functions corresponding to a second order band-pass filter.

7. Circuitry according to claim 1, wherein the sense circuitry comprises a sense impedance.

8. Circuitry according to claim 7, wherein the sense impedance comprises one or more of: a capacitor, a resistor and an inductor.

9. Circuitry according to claim 1, wherein the circuitry further comprises system identification circuitry configured to determine the transfer function.

10. Circuitry according to claim 9, wherein the system identification circuitry is configured to determine an impedance of the piezoelectric transducer based on the sense signal and the drive signal.

11. Circuitry according to claim 10, wherein the system identification circuitry is configured to determine the transfer function based on the determined impedance of the piezoelectric transducer.

12. Circuitry according to claim 10, wherein the system identification circuitry is configured to identify one or more resonance frequencies of the piezoelectric transducer based on the determined impedance.

13. Circuitry according to claim 12, wherein the system identification circuitry is configured to identify a first resonance frequency of the piezoelectric transducer, and to determine a first transfer function based on a frequency and a Q factor associated with the identified first resonance frequency.

14. Circuitry according to claim 13, wherein the system identification circuitry is configured to identify one or more further resonance frequencies of the piezoelectric transducer, and to determine one or more corresponding further transfer functions, each based on a frequency and a Q factor associated with a respective one of the one or more identified further resonance frequencies.

15. An integrated circuit comprising the circuitry of claim 1.

16. A system comprising the circuitry of claim 1 and a piezoelectric transducer.

17. Circuitry for controlling a displacement of a piezoelectric transducer, the circuitry comprising:
transducer driver circuitry for outputting a drive signal to the piezoelectric transducer;
monitoring circuitry configured to be coupled to the piezoelectric transducer and to output a sense signal indicative of an electrical signal associated with the piezoelectric transducer as a result of the drive signal;
wherein the circuitry is configured to generate a difference signal based on the drive signal and the sense signal;
wherein the circuitry further comprises processing circuitry configured to apply a transfer function to the difference signal to generate a signal indicative of a displacement of the piezoelectric transducer,
and wherein the drive signal is based on an error signal between an input signal to the circuitry, the input signal representative of a desired displacement of the piezoelectric transducer, and the signal indicative of the displacement.

18. An integrated circuit comprising the circuitry of claim 17.

19. A system comprising the circuitry of claim 17 and a piezoelectric transducer.

20. Circuitry for controlling a sound pressure level at a piezoelectric transducer, the circuitry comprising:
transducer driver circuitry for outputting a drive signal to the piezoelectric transducer;
monitoring circuitry configured to be coupled to the piezoelectric transducer and to output a sense signal indicative of an electrical signal associated with the piezoelectric transducer as a result of the drive signal;
wherein the circuitry is configured to generate a difference signal based on the drive signal and the sense signal;
wherein the circuitry further comprises processing circuitry configured to apply a transfer function to the difference signal to generate a signal indicative of a sound pressure level at the piezoelectric transducer,
and wherein the drive signal is based on an error signal between an input signal to the circuitry, the input signal indicative of a desired sound pressure level at the piezoelectric transducer, and the signal indicative of an actual sound pressure level.

* * * * *